United States Patent
Kim et al.

(10) Patent No.: US 11,146,378 B2
(45) Date of Patent: Oct. 12, 2021

(54) SIGNAL RECEIVING DEVICE AND METHOD OF RECOVERING CLOCK AND CALIBRATION OF THE DEVICE

(71) Applicant: Samsung Electronics Co., Ltd., Suwon-si (KR)

(72) Inventors: Tae-Jin Kim, Hwaseong-si (KR); Jung-Hoon Chun, Seoul (KR); Jae Youl Lee, Hwaseong-si (KR); Hyun Wook Lim, Seoul (KR)

(73) Assignees: SAMSUNG ELECTRONICS CO., LTD., Gyeonggi-do (KR); RESEARCH & BUSINESS FOUNDATION SUNGKYUNKWAN UNIVERSITY, Gyeonggi-do (KR)

( * ) Notice: Subject to any disclaimer, the term of this patent is extended or adjusted under 35 U.S.C. 154(b) by 0 days.

(21) Appl. No.: 16/889,077

(22) Filed: Jun. 1, 2020

(65) Prior Publication Data
US 2021/0091922 A1    Mar. 25, 2021

(30) Foreign Application Priority Data

Sep. 23, 2019 (KR) ........................ 10-2019-0116627

(51) Int. Cl.
*H04B 1/10* (2006.01)
*H04L 7/00* (2006.01)
(Continued)

(52) U.S. Cl.
CPC ......... *H04L 7/0079* (2013.01); *H03G 3/3036* (2013.01); *H03K 3/037* (2013.01); *H03K 19/20* (2013.01)

(58) Field of Classification Search
CPC ..... H04L 7/033; H04L 7/027; H04L 25/4917; H03F 1/3211; H03F 3/45179; G09G 5/008
(Continued)

(56) References Cited

U.S. PATENT DOCUMENTS 9,148,198 B1   9/2015 Zhang et al.
9,473,291 B2  10/2016 Kil
(Continued)

FOREIGN PATENT DOCUMENTS

WO   WO-2018/081010 A1   5/2018

OTHER PUBLICATIONS

Boser B. E. et al., "A 256-Element CMOS Imaging Receiver for Free-Space Optical Communication", IEEE Journal of Solid-State Circuits, IEEE, USA, vol. 40, No. 9, Sep. 1, 2005, pp. 1948-1956, XP011138491.

(Continued)

*Primary Examiner* — Khai Tran
(74) *Attorney, Agent, or Firm* — Harness, Dickey & Pierce, P.L.C.

(57) ABSTRACT

A signal receiving device may not need to consider jitter characteristics of a received signal by including a transition detecting device which receives first to third input signals having different signal levels for each unit interval, compares whether a signal level of a first differential signal, which is a differential signal between the first input signal and the second input signal among the first to third input signals, is greater than a first reference signal level to output a first comparison signal, and compares whether the signal level of the first differential signal is greater than a second reference signal level different from the first reference signal level to output a second comparison signal, and a clock data recovering device which recovers a clock signal embedded (Continued)

in the first to third input signals on the basis of the first and second comparison signals to output the recovery clock signal.

20 Claims, 11 Drawing Sheets

(51) Int. Cl.
    *H03G 3/30*           (2006.01)
    *H03K 3/037*         (2006.01)
    *H03K 19/20*        (2006.01)

(58) Field of Classification Search
    USPC .......................................... 375/350; 330/140
    See application file for complete search history.

(56) References Cited

U.S. PATENT DOCUMENTS

| | | |
|---|---|---|
| 9,722,822 B1 | 8/2017 | Zhang et al. |
| 9,735,950 B1 | 8/2017 | Liu et al. |
| 9,959,805 B2 | 5/2018 | Itoigawa et al. |
| 10,015,027 B2 | 7/2018 | Schober |
| 10,033,519 B2 | 7/2018 | Duan et al. |
| 2004/0229586 A1* | 11/2004 | Oshima ................ H03G 3/3068 455/240.1 |
| 2006/0045176 A1* | 3/2006 | Moughabghab ............................ H04L 25/03885 375/232 |
| 2007/0040610 A1* | 2/2007 | Kwon ................ H03G 3/3084 330/140 |
| 2013/0229294 A1* | 9/2013 | Matsuno ................ H03M 1/12 341/155 |
| 2018/0019863 A1 | 1/2018 | Liao et al. |
| 2018/0241382 A1 | 8/2018 | Wang et al. |

OTHER PUBLICATIONS

Extended European Search Report dated Feb. 19, 2021 for EP 20 19 7854.

\* cited by examiner

| Wire State | Wire Amplitude | | | Receiver diff input voltage | | |
|---|---|---|---|---|---|---|
| | A | B | C | A-B | B-C | C-A |
| +x | ¾V | ¼V | ½V | +½V | -¼V | -¼V |
| -x | ¼V | ¾V | ½V | -½V | +¼V | +¼V |
| +y | ½V | ¾V | ¼V | -¼V | +½V | -¼V |
| -y | ½V | ¼V | ¾V | +¼V | -½V | +¼V |
| +z | ¼V | ½V | ¾V | -¼V | -¼V | +½V |
| -z | ¾V | ½V | ¼V | +¼V | +¼V | -½V |

SIGNAL RECEIVING DEVICE AND METHOD OF RECOVERING CLOCK AND CALIBRATION OF THE DEVICE

This application claims priority from Korean Patent Application No. 10-2019-0116627 filed on Sep. 23, 2019 in the Korean Intellectual Property Office, and all the benefits accruing therefrom under 35 U.S.C. § 119, the disclosure of which is incorporated herein by reference in its entirety.

BACKGROUND

1. Technical Field

Example embodiments of the present inventive concepts relate to a signal receiving device, a method for recovering a clock of the signal receiving device, and/or a method of calibrating the signal receiving device.

2. Description of the Related Art

A physical interface may be used to output calculated data or receive sensed data. For example, an interface which complies with a DSI (Display System Interface) standard established by a MIPI (Mobile Industry Processor Interface) Alliance may be provided.

As an example, a 3-wire interface (C-PHY) defined by MIPI may transmit information between the devices, using a trio of conductors rather than differential pairs. Each of the three wires may be in one of three signaling states during transmission of symbols onto the C-PHY interface. The clock information is encoded in a sequence of symbols transmitted from the C-PHY link, and a receiver may generate a clock signal from the transitions between successive symbols. Therefore, in the C-PHY interface, the role of a clock-data recovery (CDR) device for recovering a maximum speed and clock information of a communication link may be important.

SUMMARY

Example embodiments of the present inventive concepts provide a signal receiving device that may recover data and clock from the received signal without considering jitter characteristics of the received signal. Therefore, a signal receiving device according to one or more example embodiments, may recover data and clock from the received signal without requiring an additional circuit for reflecting jitter characteristics of the received signal and, thus, enabling a size reduction.

Example embodiments of the present inventive concepts also provide a method for recovering a clock of a signal receiving device that does not need to consider the jitter characteristics of the received signal, thus does not require an additional circuit for reflecting the jitter characteristics of the received signal and enables a size reduction, when recovering data and clock from the received signal.

Example embodiments of the present inventive concepts also provide a method for calibrating a signal receiving device that does not need to consider the jitter characteristics of the received signal, thus does not require an additional circuit for reflecting the jitter characteristics, and enables a size reduction, when recovering data and clock from the received signal.

However, example embodiments of the present inventive concepts are not restricted to the one set forth herein. The above and other example embodiments of the present inventive concepts will become more apparent to one of ordinary skill in the art to which the example embodiments of the present inventive concepts pertain by referencing the detailed description given below.

According to an example embodiment of the present inventive concepts, there is provided a signal receiving device including a transition detecting device configured to, receive first to third input signals such that, in each of a plurality of unit intervals, the first to third input signals each have a different signal level relative to other ones of the first to third input signals, determine whether a signal level of a first differential signal, which is a differential signal between the first input signal and the second input signal among the first to third input signals, is greater than a first reference signal level to output a first comparison signal of a plurality of comparison signals, and determine whether the signal level of the first differential signal is greater than a second reference signal level different from the first reference signal level to output a second comparison signal of the plurality of comparison signals; and a clock data recovering device configured to recover a clock signal embedded in the first to third input signals based on the first comparison signal and the second comparison signal to generate a recovery clock signal.

According to an example embodiment of the present inventive concepts, there is provided a signal receiving device including a first variable gain amplifier configured to amplify a signal level of a first differential signal, which is a differential signal between a first input signal and a second input signal among first to third input signals based on a first gain control signal, the first to third input signals each having a different signal level relative to other ones of the first to third input signals in each of a plurality of unit intervals; a first level detector configured to output a first comparison signal in response to an output of the first variable gain amplifier being greater than a first reference signal level; a clock data recovering device configured to recover a clock signal embedded in the first to third input signals based on the first comparison signal to generate a recovery clock signal; and a calibration device configured to adjust the first gain control signal based on the first comparison signal According to an example embodiment of the present inventive concepts, there is provided a signal receiving device including a first level detector configured to output a first comparison signal of a plurality of comparison signals based on a first differential signal, a first reference signal level and a second reference signal level different from the first reference signal level, the first differential signal being a differential signal between a first input signal and a second input signal among a first input signal, a second input signal and a third input signal, the first to third input signals each having a different signal level relative to other ones of the first to third input signals in each of a plurality of unit intervals; a second level detector configured to output a second comparison signal of the plurality of comparison signals based on a second differential signal, the first reference signal level and the second reference signal level, the second differential signal being a differential signal between the second input signal and the third input signal among the first to third input signals; a third level detector configured to output a third comparison signal of the plurality of comparison signals based on a third differential signal, the first reference signal level and the second reference signal level, the third differential signal being a differential signal between the third input signal and the first input signal; an SR latch configured to output wire state information of the first to third input signals, based on the plurality of comparison signals; and a plurality of OR gates configured to recover a clock signal embedded in the first to third input signals based on the plurality of comparison signals to generate a recovery clock signal.

According to an example embodiment of the present inventive concepts, there is provided a method of recovering a clock signal of a signal receiving device, the method including receiving first to third input signals such that, in each of a plurality of unit intervals, the first to third input signals each have a different signal level relative to other ones of the first to third input signals; determining whether a signal level of a first differential signal, which is a differential signal between the first input signal and the second input signal among the first to third input signals, is greater than a first reference signal level to output a first comparison signal of a plurality of comparison signals; determining whether the signal level of the first differential signal is greater than a second reference signal level different from the first reference signal level to output a second comparison signal of the plurality of comparison signals; and recovering the clock signal embedded in the first to third input signals based on the first comparison signal and the second comparison signal to generate a recovery clock signal.

According to an aspect of the present inventive concept, there is provided a method for calibrating a signal receiving device, the method including receiving first to third input signals such that, in each of a plurality of unit intervals, the first to third input signals each have a different signal level relative to other ones of the first to third input signals; performing a first amplification on a first differential signal to generate a first amplified first differential signal, the first differential signal being a differential signal between a first input signal and a second input signal among the first to third input signals; determining whether a signal level of the first amplified first differential signal is greater than a first reference signal level to output a first comparison signal; determining whether a signal level of the first amplified first differential signal is greater than a second reference signal level different from the first reference signal level to output a second comparison signal; and performing a second amplification on the first differential signal based on the first comparison signal and the second comparison signal, the second amplification being different from the first amplification.

BRIEF DESCRIPTION OF THE DRAWINGS

The above and other aspects and features of the present inventive concept will become more apparent by describing in detail example embodiments thereof with reference to the attached drawings, in which.

DETAILED DESCRIPTION

Hereinafter, example embodiments of the present inventive concepts will be described below with reference to the accompanying drawings.

Figure 1:
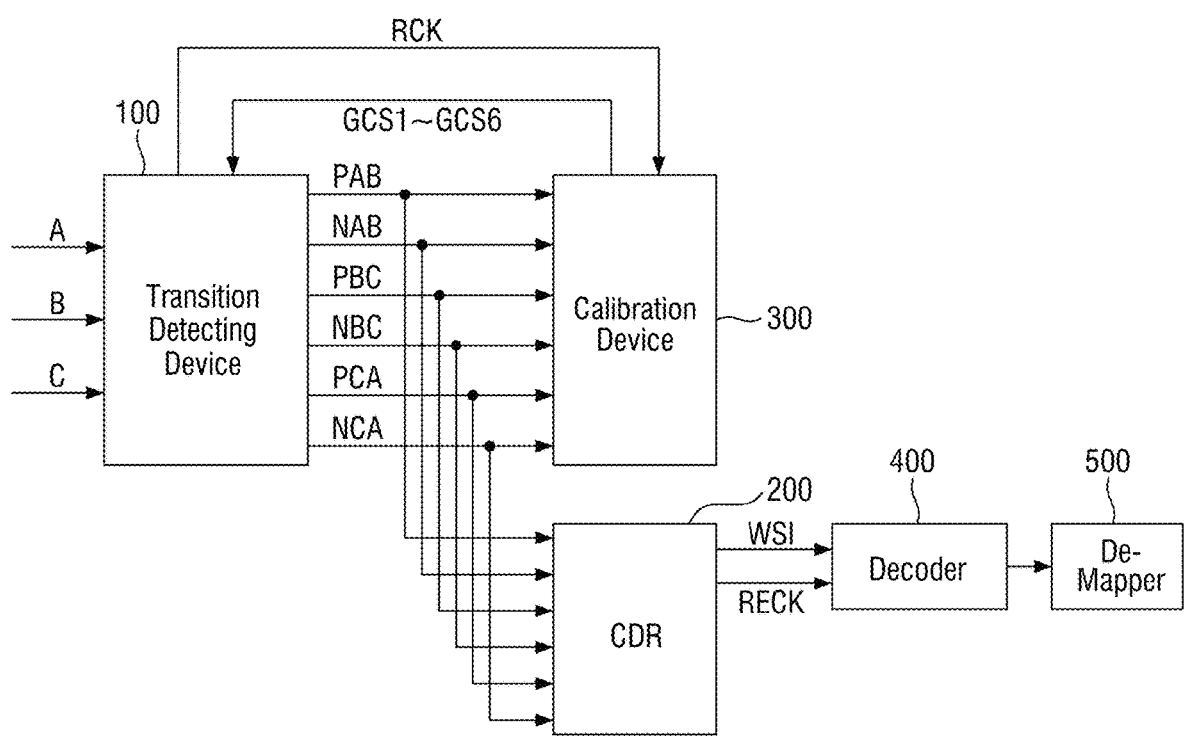
FIG. 1 is a conceptual block diagram of a signal receiving device according to some example embodiments.

FIG. 1 is a conceptual block diagram of a signal receiving device according to some example embodiments.

Referring to FIG. 1, the signal receiving device may include a transition detecting device 100, a clock data recovering device 200, and a calibration device 300.

The transition detecting device 100 receives provision of first to third input signals A, B and C, obtains a differential signal among the respective input signals A, B and C, and then compares the signal levels of each differential signal with a first reference signal level and a second reference signal level to output comparison signals PAB, NAB, PBC, NBC, PCA and NCA according to each comparison result. According to the embodiment, the term 'differential signal' may mean a signal generated by a difference between specific two signals. For example, the differential signal between the first input signal A and the second input signal B may mean a signal in which a signal level at each timing (time) is a difference (A-B) of the signal level between a signal level of the first input signal A and a signal level of the second input signal B.

Specifically, the transition detecting device 100 obtains a first differential signal (A-B) that is a differential signal between the first input signal A and the second input signal B, and then compares whether the signal level of the first differential signal (A-B) is greater than a first reference signal level to output a first comparison signal PAB. Further, the transition detecting device 100 may compare whether the signal level of the first differential signal (A-B) is greater than a second reference signal level to output a second comparison signal NAB. Also, the transition detecting device 100 obtains a second differential signal (B-C) that is a differential signal between the second input signal B and the third input signal C, and then compares whether the signal level of the second differential signal (B-C) is greater than the first reference signal level to output a third comparison signal PBC. Further, the transition detecting device 100 may compare whether the signal level of the second differential signal (B-C) is greater than the second reference signal level to output a fourth comparison signal NBC. Further, the transition detecting device 100 obtains a third differential signal (C-A) that is a differential signal between the third input signal C and the first input signal A, and then compares whether the signal level of the third differential signal (C-A) is greater than the first reference signal level to output a fifth comparison signal PCA. Also, the transition detecting device 100 may compare whether the signal level of the third differential signal (C-A) is greater than the second reference signal level to output a sixth comparison signal NCA.

According to some example embodiments, the first reference signal level and the second reference signal level may be equal in absolute value and opposite in polarity. For example, if the first reference signal level is +⅔V, the second reference signal level may be −⅔V. Further, if the first reference signal level is +⅘V, the second reference signal level may be −⅘V. More specific description of the operation of the transition detecting device 100 will be described later.

Meanwhile, the transition detecting device 100 generates a reference clock signal RCK using two input signals among the provided first to third input signals A, B and C, and may provide the reference clock signal RCK to the calibration device 300.

According to some example embodiments, although the transition detecting device 100 may generate the reference clock signal RCK, using the first input signal A and the second input signal B among the provided first to third input signals A, B and C, the example embodiments are not limited thereto.

The clock data recovering device 200 may recover the wire state information WSI, using the first to sixth comparison signals PAB to NCA and output it to the decoder 400. The clock data recovering device 200 recovers the clock signal embedded in the first to third input signals A to C, using the first to sixth comparison signals PAB to NCA, and may provide the clock signal to the decoder 400 as a recovery clock signal RECK.

The decoder 400 and a de-mapper 500 may recover the data signal provided to the first to third input signals A to C, using wire state information WSI and the recovery clock signal RECK.

On the other hand, the recovery clock signal RECK recovered by the clock data recovering device 200 may be provided to, for example, a test driver or the like, such as the demapper 500.

The calibration device 300 receives provision of the reference clock signal RCK and the first to sixth comparison signals PAB to NCA from the transition detecting device 100, and may generate gain control signals GCS1 to GCS6 on the basis thereof.

Specifically, the calibration device 300 may generate gain control signals GCS1 and GCS2 for amplifying the first differential signal (A-B), generate gain control signals GCS3 and GCS4 for amplifying the second differential signal (B−C), and generate gain control signals GCS5 and GCS6 for amplifying the third differential signal (C−A), using the reference clock signal RCK and the first to sixth comparison signals PAB to NCA. More specific operations thereof will be described later.

According to some example embodiments, the first to third input signals A to C may be signals to be provided in accordance with a MIPI (Mobile Industry Processor Interface) C-PHY interface. However, although the signal receiving device may be, for example, a device that receives an input signal through the MIPI C-PHY interface and recovers a clock and data from the received input signal, the example embodiments of the present inventive concepts are not limited thereto. For example, even if another communication interface is used, the example embodiments of the present inventive concepts may be adopted.

According to some example embodiments, the transition detecting device 100 and the clock data recovery device 200 may be disposed in an analog circuit block of the signal receiving device. A part of the calibration device 300 may be disposed in an analog circuit block of the signal receiving device, and the other part of the calibration device 300 may be disposed in a digital logic block of the signal receiving device. In some example embodiments the decoder 400 may also be disposed in the digital logic block of the signal receiving device, however the example embodiments are not limited thereto.

Hereinafter, although specific implementation examples of the signal receiving device will be described with reference to FIGS. 2 to 6, the embodiments according to the present inventive concept are not limited to the contents described below.

Figure 2:
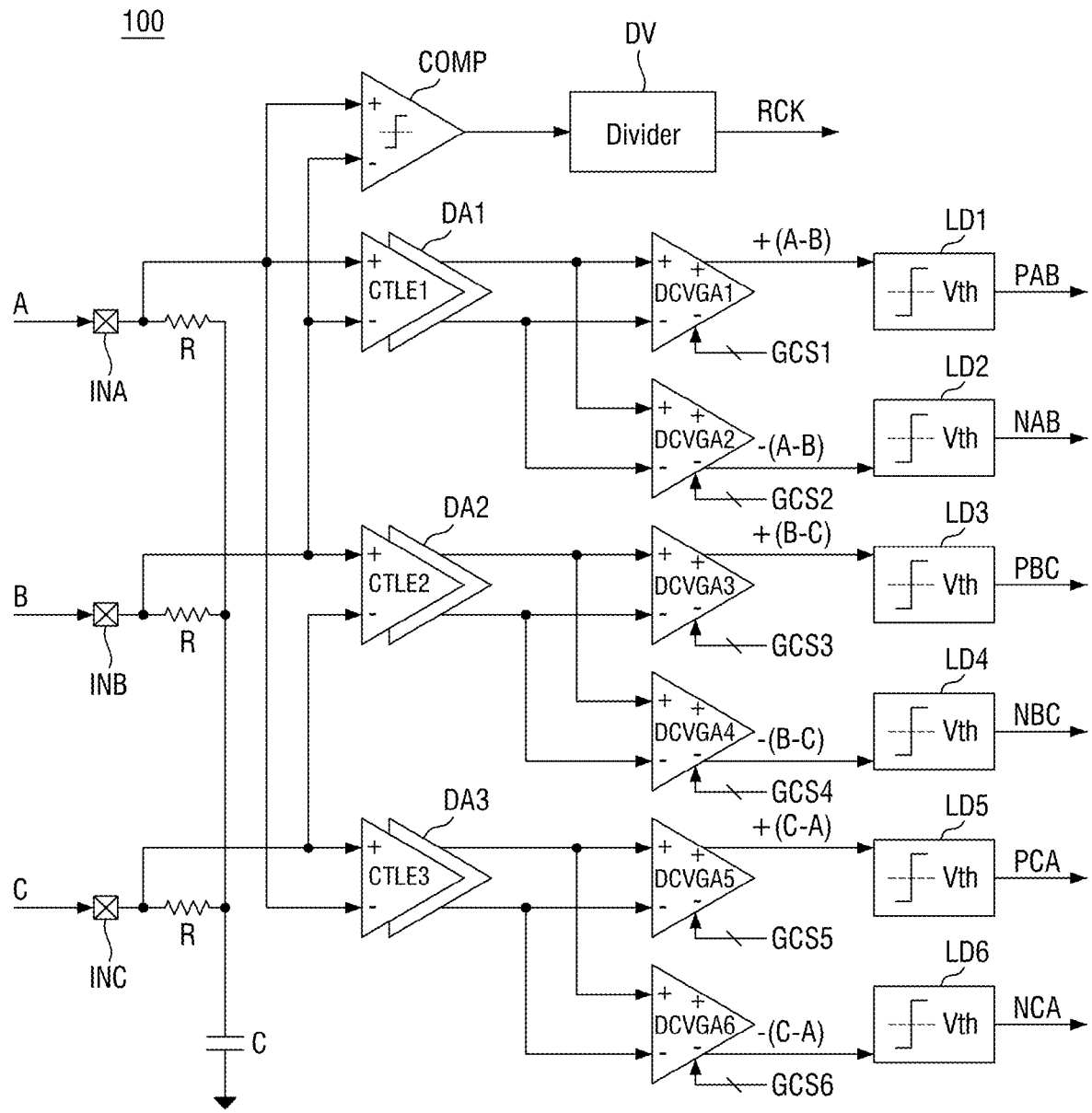
FIG. 2 is an example circuit diagram of a transition detecting device of FIG. 1.
Figure 3:
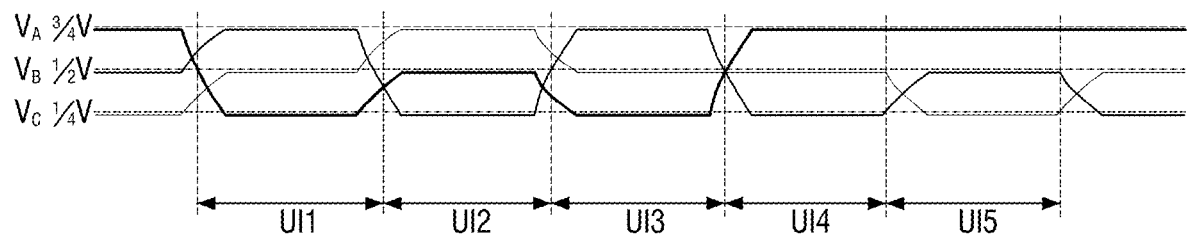
FIG. 3 is a diagram for explaining first to third input signals of FIG. 2.
Figure 4:
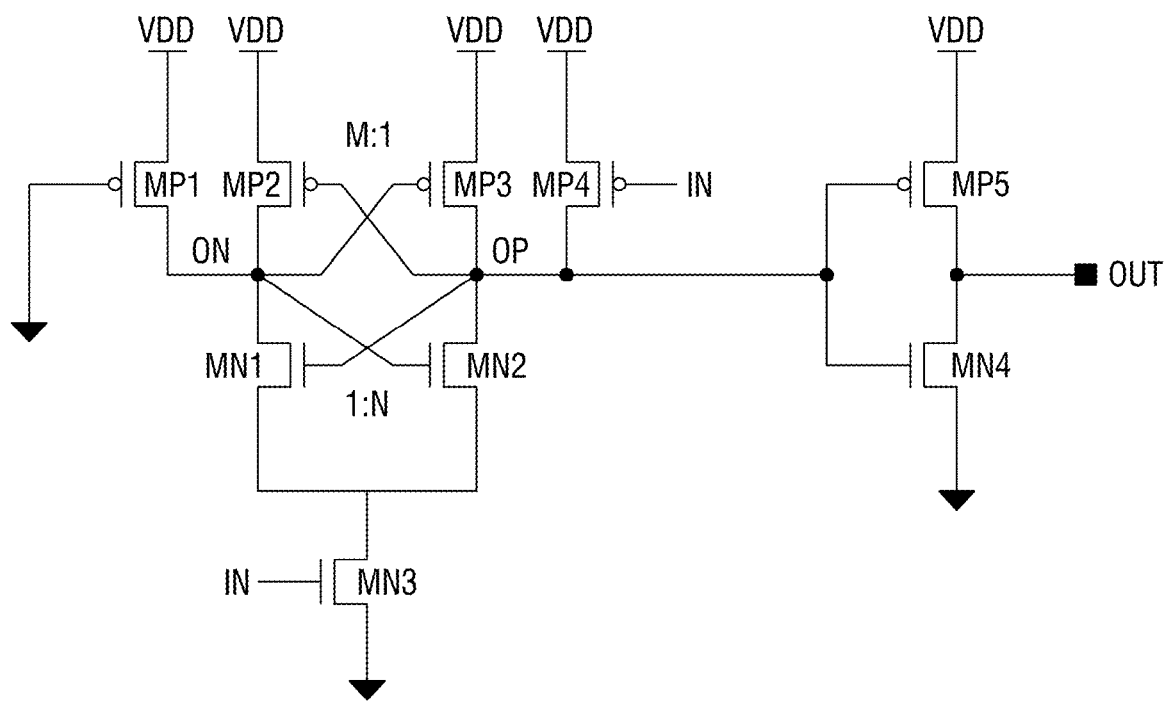
FIG. 4 is an example circuit diagram of a level detector of FIG. 2.
Figure 5:
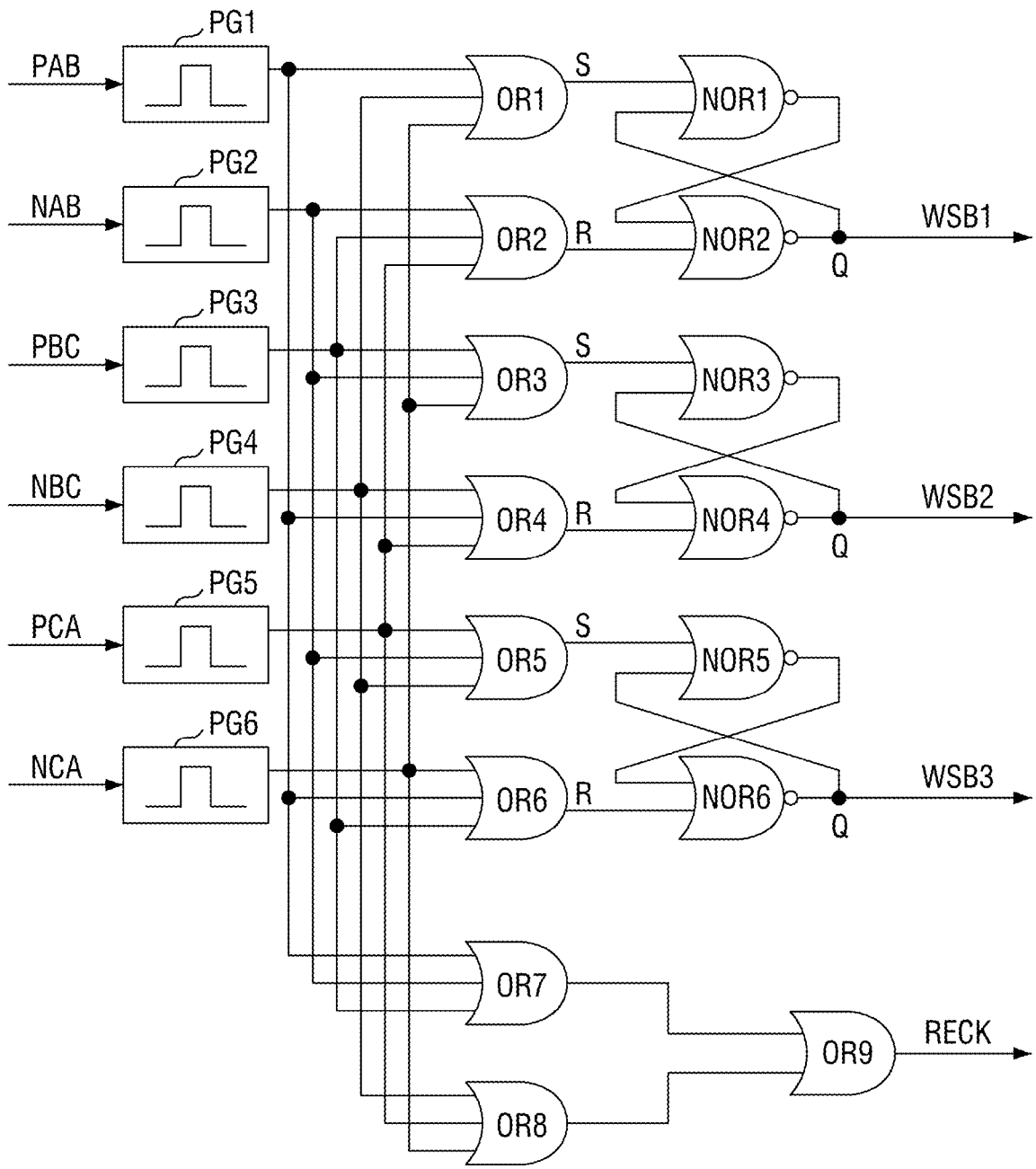
FIG. 5 is an example circuit diagram of the clock data recovering device of FIG. 1.
Figures 6, 7:
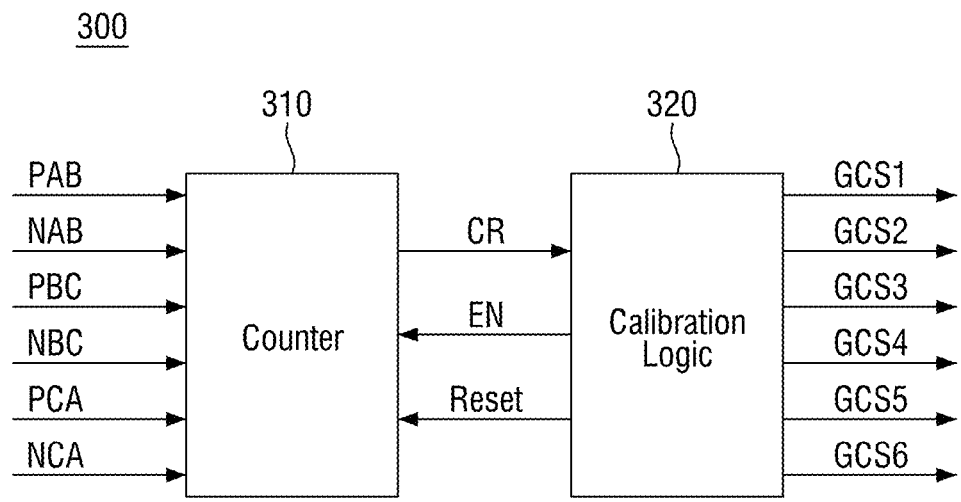
FIG. 6 is an example block diagram of the calibration device of FIG. 1.
FIGS. 7 to 11 are diagrams for explaining a method for recovering a clock and a method for recovering data of the signal receiving device according to some example embodiments.

FIG. 2 is an example circuit diagram of the transition detecting device of FIG. 1. FIG. 3 is a diagram for explaining the first to third input signals of FIG. 2. FIG. 4 is an example circuit diagram of the level detector of FIG. 2. FIG. 5 is an example circuit diagram of the clock data recovering device of FIG. 1. FIG. 6 is an example block diagram of the calibration device of FIG. 1.

Referring to FIG. 2, the transition detecting device 100 may include first to third input terminals INA to INC to which first to third input signals A to C are input, respectively.

The first input signal A may be provided to the first input terminal INA, the second input signal B may be provided to the second input terminal INB, and the third input signal C may be provided to the third input terminal INC. A resistor R and a capacitor C may be connected to the first to third input terminals INA to INC, respectively, for receiving signals, as shown in FIG. 2.

Referring to FIG. 3, the first to third input signals A to C may have different signal levels from each other for each unit interval.

Specifically, the first to third input signals A to C may have any one signal level among ¾V, ½V, and ¼V, respectively.

For example, at a unit interval UI1, the first input signal A has a signal level of ¼V, the second input signal B has a signal level of ¾V, and the third input signal C may have a signal level of ½V. That is, the first to third input signals A to C do not have the same signal level at the respective unit intervals UI1 to UI5 but have signal levels different from each other.

On the other hand, when the unit intervals UI1 to UI5 change, the signal levels of at least two input signals among the first to third input signals A to C change. In the situation in which the first to third input signals A to C have signal levels different from each other at each of the unit intervals UI1 to UI5, when the unit interval UI1 to UI5 change, if the signal level of one input signal changes, the signal level of at least the other input signal needs to change so that the first to third input signals A to C may have signal levels different from each other at the respective unit intervals UI1 to UI5. Therefore, when the unit intervals UI1 to UI5 change, the signal levels of at least two input signals among the first to third input signals A to C may change.

According to some example embodiments, because the first to third input signals A to C are signals provided in accordance with the MIPI C-PHY interface, each of the first to third input signals A to C may have any one signal level among ¾V, ½V and ¼V.

Referring to FIG. 2 again, the transition detecting device 100 may include a continuous time linear equalizer CTLE1 to CTLE3, differential amplifiers DA1 to DA3, and digitally controlled variable gain amplifiers DCVGA1 to DCVGA6.

The first digitally controlled variable gain amplifier DCVGA1 amplifies the first differential signal (A−B) in accordance with the gain control signal GCS1, and may output it as a first comparison input signal (+(A−B)) with no phase change. Further, a first level detector LD1 may compare whether the signal level of the first comparison input signal (+(A−B)) is greater than the first reference signal level Vth to output the first comparison signal PAB.

The second digitally controlled variable gain amplifier DCVGA2 may amplify the first differential signal (A−B) in accordance with the gain control signal GCS2, invert its phase, and output it as a second comparison input signal (−(A−B)). Further, the second level detector LD2 may compare whether the signal level of the second comparison input signal (−(A−B)) is greater than the first reference signal level Vth to output a second comparison signal NAB.

Here, as described above, if the first reference signal level Vth and the second reference signal level −Vth have a relationship in which the absolute values are the same and the phases are opposite to each other, since the second comparison input signal (−(A−B)) has the opposite phase of the first comparison input signal (+(A−B)), the actual operation of the second level detector LD2 compares whether the signal level of the first differential signal (A−B) is greater than the second reference signal level −Vth (that is, whether it has a value smaller than −Vth).

That is, although the actual operation of the second level detector LD2 compares the signal level of the first differential signal (A−B) with the second reference signal level −Vth to output the second comparison signal NAB unlike the operation of the first level detector LD1, by configuring the circuit as shown, the first level detector LD1 and the second level detector LD2 may achieve the target, while performing the same operation.

The third digitally controlled variable gain amplifier DCVGA3 may amplify the second differential signal (B−A) in accordance with the gain control signal GCS3, and may output it as a third comparison input signal (+(B−C)) with no phase change. Further, the third level detector LD3 may compare whether the signal level of the third comparison input signal (+(B−C)) is greater than the first reference signal level Vth to output the third comparison signal PBC.

The fourth digitally controlled variable gain amplifier DCVGA4 may amplify the second differential signal (B−C) in accordance with the gain control signal GCS4, invert its phase, and output it as a fourth comparison input signal (−(B−C)). Further, the fourth level detector LD4 may compare whether the signal level of the fourth comparison input signal (−(B−C)) is greater than the first reference signal level Vth to output a fourth comparison input signal NBC. Here, although the actual operation of the fourth level detector LD4 also compares whether the signal level of the second differential signal (B−C) is greater than the second reference signal level −Vth (that is, whether it has a value smaller than −Vth), by configuring the circuit as shown, the third level detector LD3 and the fourth level detector LD4 may achieve the target, while perform the same operations.

The fifth digitally controlled variable gain amplifier DCVGA5 may amplify the third differential signal (C−A) in accordance with the gain control signal GCS5 to output it as a fifth comparison input signal +(C−A) without phase change. Further, the fifth level detector LD5 may compare whether the signal level of the fifth comparison input signal (+(C−A)) is greater than the first reference signal level Vth to output the fifth comparison input signal PCA.

The sixth digitally controlled variable gain amplifier DCVGA6 may amplify the third differential signal (C−A) in accordance with the gain control signal GCS6, invert its phase, and output it as a sixth comparison input signal (−(C−A)). Further, the sixth level detector LD6 may compare whether the signal level of the sixth comparison input signal (−(C−A)) is greater than the first reference signal level Vth to output a sixth comparison signal NCA. Here, although the actual operation of the sixth level detector LD6 also compares whether the signal level of the third differential signal (C−A) is greater than the second reference signal level −Vth (that is, whether it has a value smaller than −Vth), by configuring the circuit as shown, the fifth level detector LD5 and the sixth level detector LD6 may achieve the target, while performing the same operation with each other.

Referring to FIG. 2 again, the transition detecting device 100 may include a comparator COMP that compares the first input signal A with the second input signal B to output a comparison result, and a divider DIV that divides the comparison signal which is output from COMP. The divided signal which is output from the divider DIV may be provided to the calibration device (300 of FIG. 1) as a reference clock signal RCK.

Although the comparator COMP that compares the first input signal A with the second input signal B to output a comparison result is shown in the drawing, the example embodiments of the present inventive concepts are not limited thereto. According to some example embodiments, the comparator COMP may be implemented by being modified to compare the second input signal B with the third input signal C to output a comparison result or to compare the third input signal C with the first input signal A to output a comparison result.

Next, referring to FIG. 4, the first level detector LD1 may include a plurality of transistors MP1 to MP5 and MN1 to MN4 for level detecting of the provided signals. Although only an example circuit diagram of the first level detector LD1 is shown in the drawing, the same or similar circuit may be adopted for the other level detectors LD2 to LD6.

The first comparison input signal (+(A−B) of FIG. 2) described above may be provided to the input terminal IN of the first level detector LD1. Further, the first comparison signal PAB may be output to the output terminal OUT.

The transistor MP1 may be gated to the ground voltage to provide the power supply voltage VDD to the output node ON. When the transistor MP1 includes a PMOS transistor, the power supply voltage VDD may always be provided to the output node ON.

The transistor MP4 may be gated to the voltage level of the input terminal IN to provide the power supply voltage VDD to the output node OP. Therefore, the voltage level of the output node OP may change depending on the voltage level of the first comparison input signal (+(A−B) of FIG. 2).

The transistors MP5 and MN4 may invert the voltage level of the output node OP and provide the inverted output node to the output OUT. That is, the transistors MP5 and MN4 may constitute an inverter.

The transistors MP2, MP3, MN1, MN2 and MN3 may amplify a voltage level difference between the output node OP and output node ON, in accordance with the first comparison input signal (+(A−B) of FIG. 2) which is provided to the input terminal IN. Specifically, when the voltage level (or the signal level, hereinafter commonly referred to as the voltage level) of the first comparison input signal (+(A−B) of FIG. 2) is greater than the threshold voltage Vth of the transistor MN3, the transistor MN3 is turned on, and the voltage level difference between the output node OP and the output node ON may be amplified. Conversely, when the voltage level of the first comparison input signal (+(A−B) of FIG. 2) is smaller than the threshold voltage Vth of the transistor MN3, since the transistor MN3 is not turned on, the output node OP and the output node ON may maintain substantially similar voltage level. Therefore, the voltage level difference between the output node OP and the output node ON is not amplified.

According to some example embodiments, the threshold voltage Vth for turning on the transistor MN3 may be the first reference signal level Vth and the second reference signal level −Vth which is compared with the first to third input signals A, B and C by the transition detecting circuit (100 of FIG. 1). That is, if the threshold voltage Vth of the transistor MN3 increases, the first reference signal level Vth and the second reference signal level −Vth compared with the first to third input signals A, B and C by the transition detecting circuit (100 of FIG. 1) also increase, and if the threshold voltage Vth of the transistor MN3 decreases, the first reference signal level Vth and the second reference signal level −Vth compared with the first to third input signals A, B and C by the transition detecting circuit (100 of FIG. 1) may also decrease.

The transistor MP2 is gated to the voltage level of the output node OP to provide the power supply voltage VDD to the output node ON, and the transistor MP3 may be gated to the voltage level of the output node ON to provide the power supply voltage VDD to the output node OP.

The transistor MN1 is gated to the voltage level of the output node OP to connect the output node ON to the transistor MN3, and the transistor MN2 may be gated to the voltage level of the output node ON to connect the output node OP to the transistor MN3. When the voltage level of the first comparison input signal (+(A−B) of FIG. 2) becomes greater than the threshold voltage Vth of the transistor MN3, the transistor MN3 is turned on, and the output node OP and the output node ON may be grounded.

According to some example embodiments, the transistor MP2 and the transistor MP3 have an asymmetric structure to amplify the voltage level difference between the output node OP and the output node ON, and the transistor MN1 and the transistor MN2 may have an asymmetric structure.

For example, the magnitude of the transistor MP2 and the magnitude of the transistor MP3 may be different from each other, and the magnitude of the transistor MN1 and the magnitude of the transistor MN2 may be different from each other. Specifically, according to some example embodiments, if the magnitude of the transistor MP3 is set as 1, the magnitude of the transistor MP2 may be M (M is a natural number greater than 1), and if the magnitude of the transistor MN1 is set as 1, the magnitude of the transistor MN2 may be N (N is a natural number greater than 1).

For example, the number of transistors MP2 and the number of transistors MP3 may be different from each other, and the number of transistors MN1 and the number of transistors MN2 may be different from each other. Specifically, according to some embodiments, if the number of transistors MP3 is set as one, the number of transistors MP2 may be M, and if the number of transistors MN1 is set as one, the number of transistors MN2 may be N.

Also, according to some example embodiments, both the transistor MP2 and the transistor MP3 may be asymmetric in magnitude and number, and both the transistor MN1 and the transistor MN2 may be asymmetric in magnitude and number.

Next, an example circuit of the clock data recovering device will be described with reference to FIGS. 1 and 5.

Referring to FIGS. 1 and 5, the clock data recovering device 200 may include a plurality of pulse generators PG1 to PG6, a plurality of OR gates OR1 to OR9, and a plurality of SR latches NOR1 to NOR6.

The OR gates OR7, OR8 and OR9 may form a clock recovery path, and OR gates OR1 to OR6 and SR latches NOR1 to NOR6 may form a data recovery path.

Each of a plurality of pulse generators PG1 to PG6 may receive provision of the first to sixth comparison signals PAB, NAB, PBC, NBC, PCA and NCA to generate a short pulse. At this time, rising edges of the short pulses generated by the respective pulse generators PG1 to PG6 may correspond to rising edges of the first to sixth comparison signals PAB, NAB, PBC, NBC, PCA and NCA. That is to say, the rising edges of the pulse generators PG1 to PG6 may also be generated at the timing when the rising edges of the first to sixth comparison signals PAB, NAB, PBC, NBC, PCA and NCA are generated.

As described above, since the rising edges of the first to sixth comparison signals PAB, NAB, PBC, NBC, PCA and NCA are generated at the timing when the first to third differential signals (A−B, B−C and C−A) become greater than the first reference signal level Vth or the second reference signal level −Vth in accordance with the operations of the first to sixth level detectors (LD1 to LD6 of FIG. 2), the rising edges of the short pulses generated by the pulse generators PG1 to PG6 may also be generated at the timing when the first to third differential signals (A−B, B−C and C−A) become greater than the first reference signal level Vth or the second reference signal −Vth.

An OR gate OR1 may perform an OR operation on the short pulses generated from the pulse generators PG1, PG4 and PG6, and the OR gate OR2 may perform an OR operation on the short pulses generated from the pulse generators PG2, PG3 and PG5. The operation results of the OR gate OR1 and the OR gate OR2 are input to the SR latch made up of the NOR gates NOR1 and NOR2, and may be output as a wire state bit WSB1 of the first input signal (A of FIG. 1).

The OR gate OR3 may perform the OR operation on the short pulses generated from the pulse generators PG2, PG3 and PG6, and the OR gate OR4 may perform the OR operation on the short pulses generated from the pulse generators PG1, PG4 and PG5. The operation results of the OR gate OR3 and the OR gate OR4 are input to the SR latch made up of the NOR gates NOR3 and NOR4, and may be output as a wire state bit WSB2 of the second input signal (B of FIG. 1).

The OR gate OR5 may perform the OR operation on the short pulses generated from the pulse generators PG2, PG4 and PG5, and the OR gate OR6 may perform the OR operation on the short pulses generated from the pulse generators PG1, PG3 and PG6. The operation results of the OR gate OR5 and the OR gate OR6 are input to the SR latch made up of NOR gates NOR5 and NOR6, and may be output as a wire state bit WSB3 of the third input signal (C of FIG. 1).

The wire state information WSI shown in FIG. 1 may be made up of the wire state bits WSB1 to WSB3.

On the other hand, the OR gate OR7 may perform the OR operation on the short pulses generated from the pulse generators PG1, PG2 and PG3, and the OR gate OR8 may perform the OR operation on the short pulses generated from the pulse generators PG4, PG5 and PG6. Further, the OR gate OR9 may perform the OR operation on the outputs of the OR gate OR7 and the OR gate OR8. The output of the OR gate OR9 may be provided, for example, to a test driver (500 of FIG. 1) or the like in the form of a recovery clock signal RECK.

The structure of such a clock recovery path will be explained. The recovery clock signal RECK may be generated so that the rising edge of the recovery clock signal RECK corresponds to the earliest rising edge among the rising edges of the first to sixth comparison signals PAB, NAB, PBC, NBC, PCA and NCA. Further, if only one of the first to sixth comparison signals PAB, NAB, PBC, NBC, PCA and NCA has the rising edge in one unit interval, the rising edge of the recovery clock signal RECK may be formed to correspond to the rising edge of the comparison signal having the rising edges among the first to sixth comparison signals PAB, NAB, PBC, NBC, PCA and NCA.

An example configuration of the calibration device will be described with reference to FIGS. 1 and 6.

Referring to FIGS. 1 and 6, the calibration device 300 may include a counter 310 which counts the first to sixth comparison signals PAB, NAB, PBC, NBC, PCA and NCA, and a calibration logic 320 that provides a control signal EN and Reset to the counter 310 and adjusts gain control signals GCS1 to GCS6, using the counting result CR that is output from the counter 310.

According to some embodiments, although the counter 310 may be disposed in the analog circuit block of the signal receiving device, and the calibration logic 320 may be disposed in the digital logic block of the signal receiving device, the embodiments are not limited thereto.

The counter 310 may count the first to sixth comparison signals PAB, NAB, PBC, NBC, PCA and NCA, and may output a counting result CR on the basis of the counted comparison signals. According to some example embodiments, the counter 310 may count the number of signals that are logic level high among the first to sixth comparison signals PAB, NAB, PBC, NBC, PCA and NCA, and may output the counting result CR on the basis of the number of signals. Specifically, if the number of signals that are logic level high among the first to sixth comparison signals PAB, NAB, PBC, NBC, PCA and NCA is less than 6, the counter 310 may output the counting result CR of the first level (e.g., a low level). If the number of signals that are logic level high among the first to sixth comparison signals PAB, NAB, PBC, NBC, PCA and NCA is 6 or more, the counter 310 may output the counting result CR of the second level (e.g., a high level). However, the example embodiments are not limited thereto.

The calibration logic 320 may provide an enable signal EN to the counter 310 to enable the counter 310 and provide a reset signal Reset to reset the counter 310. Further, the calibration logic 320 may adjust the gain control signals GCS1 to GCS6 on the basis of the counting result CR.

According to some example embodiments, the calibration logic 320 increases the magnitudes of the gain control signals GCS1 to GCS6 while the counting result CR of a first level (e.g., a low level) is provided so that the magnitudes of the first to third differential signals (A–B, B–C and C–A) are gradually amplified. Further, when the counting result CR of the second level (e.g., a high level) is provided, the calibration logic 320 may maintain the magnitudes of the gain control signals GCS1 to GCS6 to stop the amplification of the magnitudes of the first to third differential signals (A–B, B–C and C–A). More specific explanation thereof will be given later.

Hereinafter, a method for recovering a clock of the signal receiving device explained above and a method for recovering data thereof will be explained with reference to FIGS. 7 to 11.

FIGS. 7 to 11 are diagrams for explaining a method for recovering the clock of the signal receiving device according to some example embodiments and a method for recovering data thereof.

Referring to FIG. 7, when the first to third input signals A to C provided by the MIPI C-PHY interface have different signal levels for each unit interval as shown in FIG. 3, the first to third differential signals (A–B, B–C and C–A) may have the signal level as shown in FIG. 7.

For example, when a differential signal having a magnitude of ½V or –½V is defined as a strong signal, and a differential signal having a magnitude of ¼V or –¼V is defined as a weak signal, the first to third differential signals (A–B, B–C and C–A) are made up of one strong signal and two weak signals for each unit interval.

For example, referring to FIG. 7, if the wire state is +x, since the first differential signal (A–B) is ½V, it is a strong signal, and since the second and third differential signals (B–C and C–A) are –¼V, they are weak signals. Also, if the wire state is –y, since the second differential signal (B–C) is –½V, it is a strong signal, and since the first and third differential signals (A–B and C–A) are +¼V, they are weak signals. In this way, the first to third differential signals (A–B, B–C and C–A) are made up of one strong signal and two weak signals for each unit interval in any events.

Figure 8:
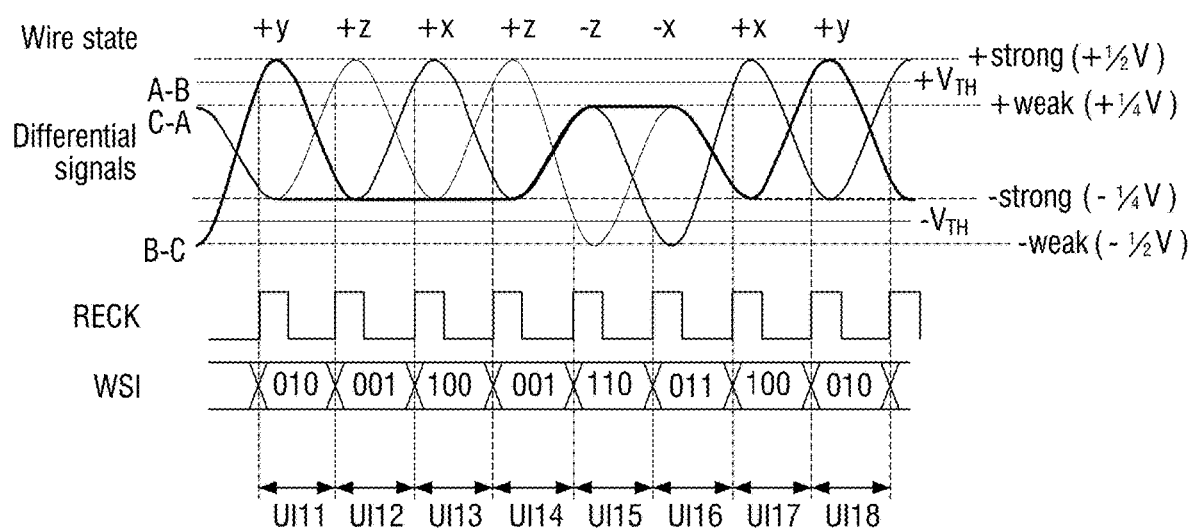

Therefore, as shown in FIG. 8, if the first reference signal level +Vth is determined as a value between the strong signal value +½V and the weak signal value +¼V, and the second reference signal level –Vth is determined as a value between the strong signal value –½V and the weak signal value –¼V, only the magnitude of one differential signal for each of the unit intervals UI1 to UI18 is greater than the first reference signal level +Vth and the second reference signal level –Vth, and the magnitudes of the remaining two differential signals are smaller than the first reference signal level +Vth and the second reference signal level –Vth.

That is to say, a transition occurs in which only one differential signal among the first to third differential signals (A–B, B–C and C–A) becomes greater than the first reference signal level +Vth and the second reference signal level –Vth for each of the unit intervals UI1 to UI18. If the clock signals embedded in the first to third input signals A to C are recovered using such characteristics, there is no need to consider the jitter characteristics of the received signal. This is because only one transition occurs for each of the unit intervals UI11 to UI18.

If the reference signal level is set differently and two or more transitions occur for each of the unit intervals UI11 to UI18, jitter characteristics may need to be considered depending on the different transition timings in order to recover the clock signal embedded in the first to third input signals A to C from the transition. Accordingly, a separate additional circuit (for example, a delay circuit, a signal masking circuit, etc.) for adjusting the jitter characteristic may be required.

In contrast, in the signal receiving device according to the present example embodiments, since the transition of the reference signal level does not occur a plurality of times, there is no need to consider the jitter characteristics of the received signal when recovering the clock signals embedded in the first to third input signals A to C, and there is no need for an additional circuit for adjusting the jitter characteristics. Therefore, the magnitude of the signal receiving device may be reduced.

Hereinafter, the operation of the signal receiving device in the unit interval UI11 of FIG. 8 will be described with reference to FIGS. 7 to 11.

Referring to FIGS. 7 and 8, the wire state is +y in the unit interval UI11. As a result, the first input signal A has a magnitude of ½V (exactly, although the signal swings to have a magnitude of ½V, only the maximum will be mentioned for the convenience of explanation), the second input signal B has a magnitude of ¾V, and the third input signal C has a magnitude of ¼V.

In accordance with the first to third input signals A to C, the first differential signal (A–B) has a magnitude of –¼V (similarly, exactly although the signal swings to have a magnitude ½V, only the maximum value will be mentioned for the convenience of explanation), the second differential signal (B–C) has a magnitude of +½V, and the third differential signal (C–A) has a magnitude of –¼V.

Figure 9:
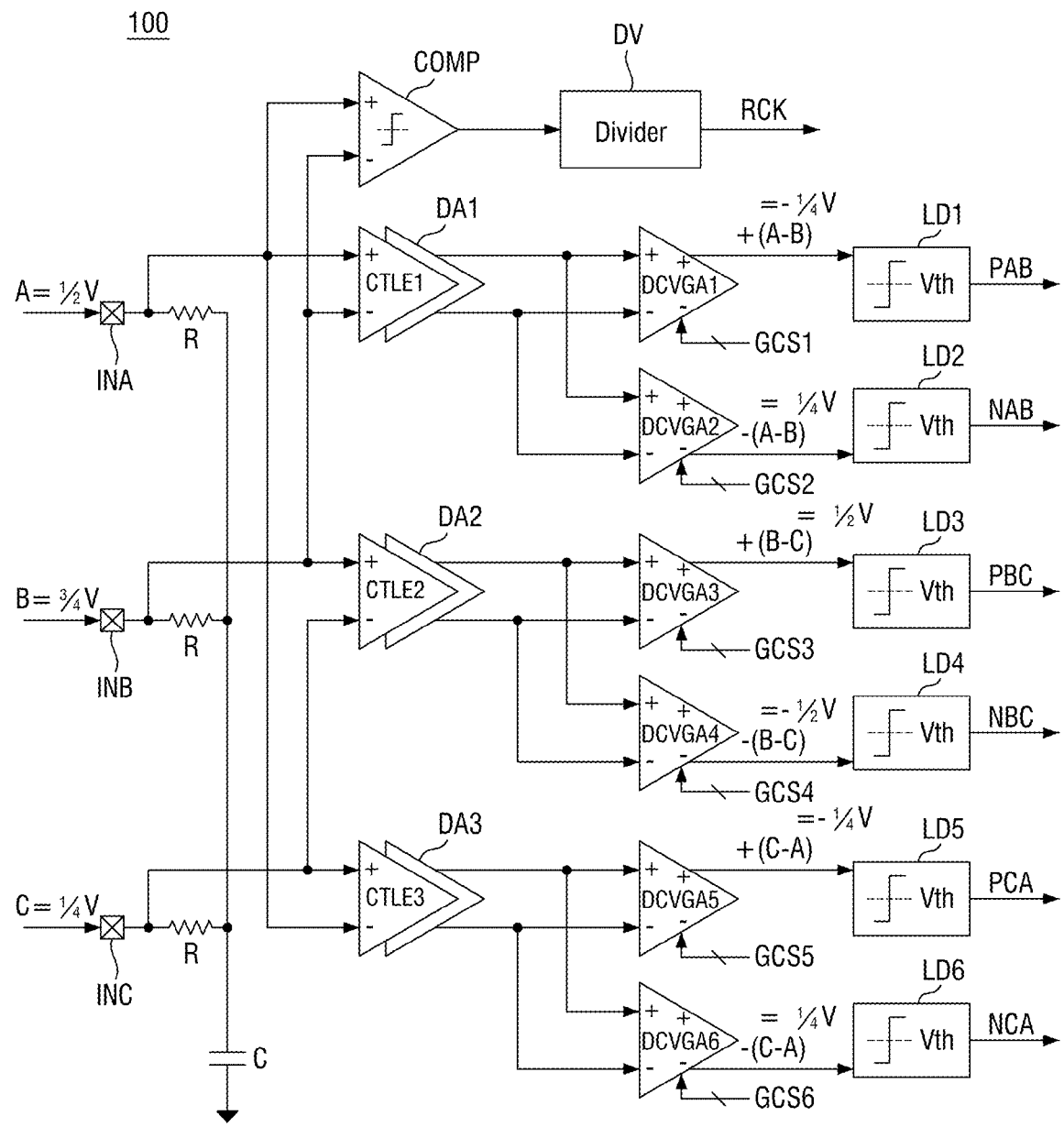

Referring now to FIG. 9, the first digitally controlled variable gain amplifier DCVGA1 provides a first differential signal (A–B) having a magnitude of –¼V to the first level detector LD1, and the second digitally controlled variable gain amplifier DCVGA2 changes the phase of the first differential signal (A–B) having a magnitude of –¼V, and may provide the signal having a magnitude of ¼V to the second level detector LD1.

The third digitally controlled variable gain amplifier DCVGA3 provides a second differential signal (B–C) having a magnitude of ½V to the third level detector LD3, and the fourth digitally controlled variable gain amplifier DCVGA4 changes the phase of the second differential signal (B–C) having the magnitude of ½V, and may provide the signal having the magnitude of –½V to the fourth level detector LD4.

The fifth digitally controlled variable gain amplifier DCVGA5 provides the third differential signal (C–A) having a magnitude of –¼V to the fifth level detector LD5, and the sixth digitally controlled variable gain amplifier DCVGA6 changes the phase of the third differential signal (C–A) having the magnitude of –¼V and may provide the signal having the magnitude of ¼V to the sixth level detector LD6.

Figure 10:
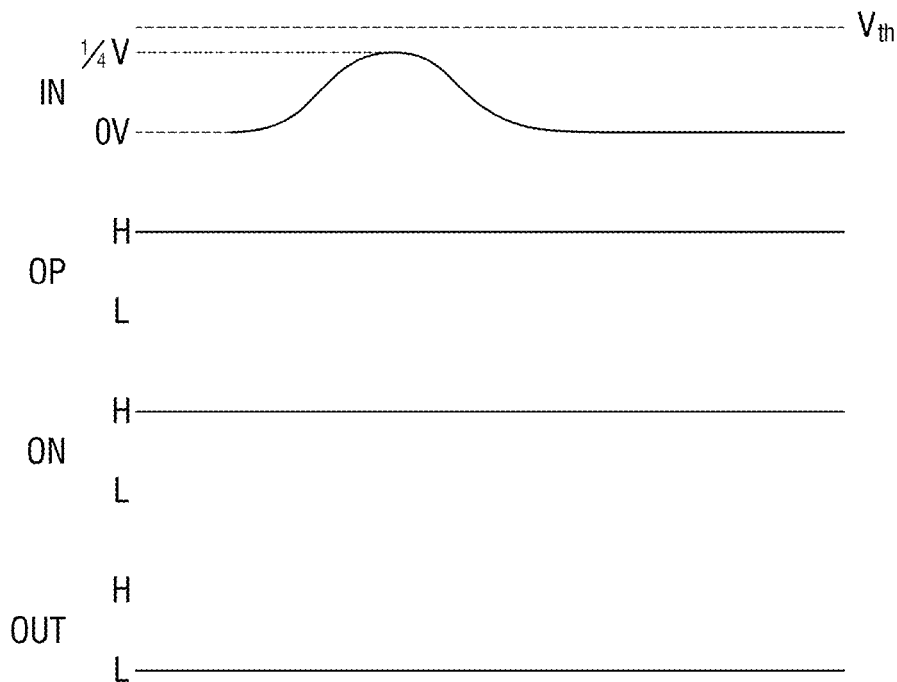

Now, referring to FIGS. 4, 9 and 10, a signal less than the threshold voltage Vth of the transistor MN3 is provided to the input terminals IN of the first and second level detectors LD1 and LD2 and the fourth to sixth level detectors LD4 to LD6. Therefore, the transistor MN3 is not turned on, and the voltage level difference between the output nodes ON and OP is also not amplified. Accordingly, arising edge is not generated at the first and second comparison signals PAB and NAB and the fourth to sixth comparison signals NBC, PCA and NCA that are output from the first and second level detectors LD1 and LD2 and the fourth to sixth level detectors LD4 to LD6.

Figure 11:
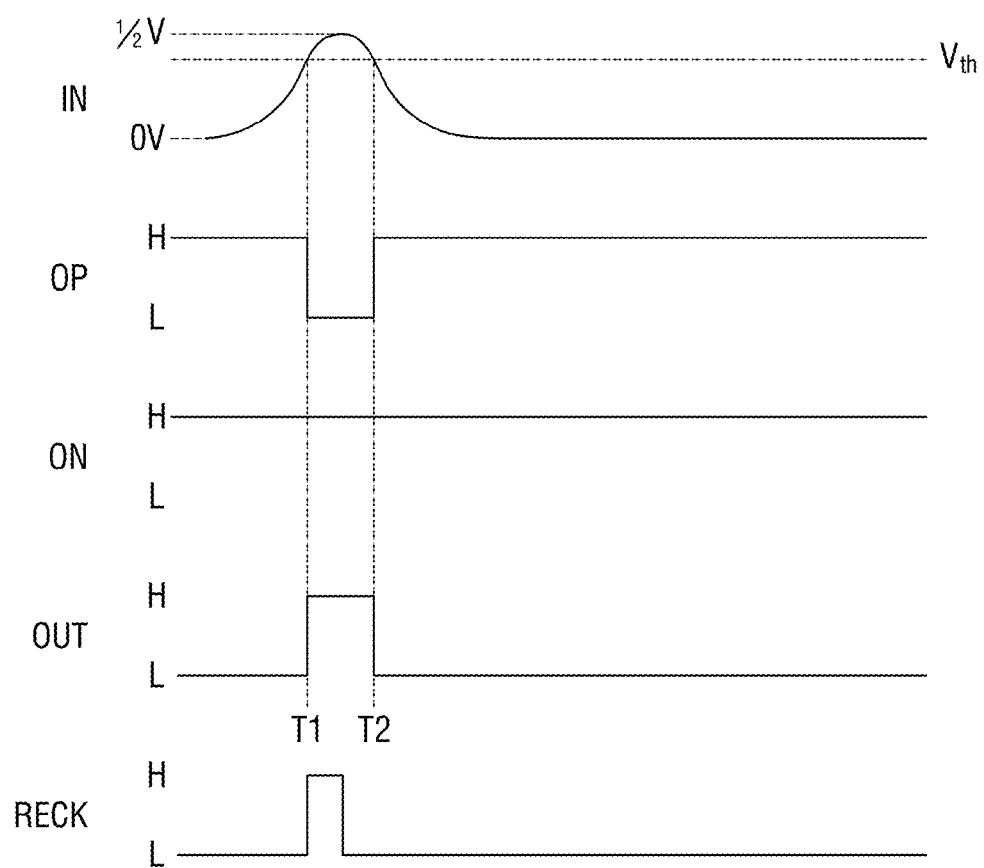

However, referring to FIGS. 4, 9 and 11, a signal equal to or higher than the threshold voltage Vth of the transistor MN3 is provided to the input terminal IN of the third level detector LD3. Accordingly, the transistor MN3 is turned on at a timing T1 when the magnitude of the signal to be provided to the input stage IN becomes equal to or higher than the threshold voltage Vth of the transistor MN3.

In this way, if the transistor MN3 is turned on, the voltage level of the output node OP decreases, due to an asymmetric structure between the transistor MP2 and the transistor MP3 and an asymmetric structure between the transistor MN1 and the transistor MN2. On the other hand, the voltage level of the output node ON is maintained without decrease. As a result, the voltage level difference between the output nodes ON and OP is amplified, and the rising edge is generated at the signal which is output to the output terminal OUT, due to the inverter. That is, the rising edge is generated at the third comparison signal PBC that is output from the third level detector LD3. Thereafter, at timing T2 when the magnitude of the signal to be provided to the input stage IN becomes equal to or lower than the threshold voltage Vth of the transistor MN3, the transistor MN3 is turned off, and a falling edge may be formed at the signal to be output to the output terminal OUT.

The first and second comparison signals PAB and NAB and the fourth to sixth comparison signals NBC, PCA and NCA in which no rising edge is generated, and the third comparison signal PBC in which the rising edge is generated may be input to the clock data recovery device 200 shown in FIG. 5 and used to generate the wire state bits WSB1 and WSB3 and the recovery clock signal RECK.

Specifically, the clock data recovering device 200 may generate a predetermined short pulse from the first and second comparison signals PAB and NAB and the fourth to sixth comparison signals NBC, PCA and NCA in which no rising edge is generated, and the third comparison signal PBC in which the rising edge is generated, and may generate a state bit WSB1 having a value of 0, a state bit WSB2 having a value of 1, a state bit WSB3 having a value of 0, and a recovery clock signal RECK having a rising edge corresponding to the rising edge of the third comparison signal PBC as shown in FIG. 8, using the generated short pulse.

Since the operation of the signal receiving device at other unit intervals UI12 to UI18 of FIG. 8 not explained can sufficiently be analogized by a person who has ordinary knowledge in this technical field through the above explanation, repeated explanation will not be provided.

Hereinafter, a calibration method of the signal receiving device described above will be described with reference to FIG. 12.

Figure 12:
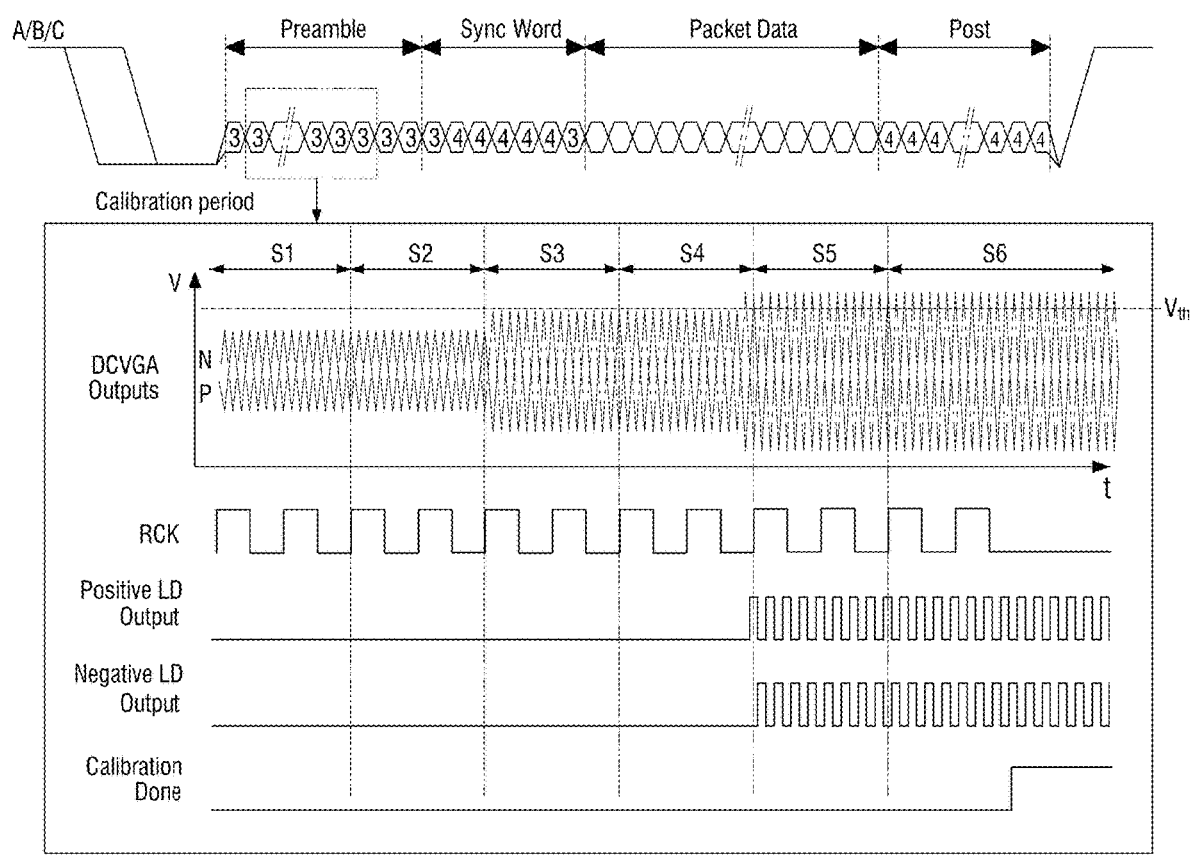
FIG. 12 is a diagram for explaining a method for calibrating the signal receiving device according to some example embodiments.

Referring to FIG. 12, the first to third input signals A to C may include a preamble period, a sync-word period, a packet data period, and a post period.

The preamble period is made up of a plurality of groups including seven consecutive "3" symbols, and the first to third differential signals (A–B, B–C and C–A) may have the same pattern of weak high, strong high, weak high, weak low, strong low, and weak low during six unit intervals.

A calibration device 300 of FIG. 6 according to the present embodiment may execute calibration for adjusting the gain control signals GCS1 to GCS6 of FIG. 6 in such a preamble period.

Specifically, the gain control signals GCS1 to GCS6 of FIG. 6 are adjusted during a plurality of periods S1 to S6 to consistently amplify the magnitudes of the first to third differential signals (A–B, B–C and C–A), and may adjust the gain control signals GCS1 to GCS6 of FIG. 6, until all the amplified first to third differential signals (A–B, B–C and C–A) become greater than the first reference signal level Vth and/or the second reference signal level –Vth. Such an operation may be performed, for example, by counting the first to sixth comparison signals PAB, NAB, PBC, NBC, PCA and NCA as described above.

If the gains of the digitally controlled variable gain amplifiers DCVGA1 to DCVGA6 are not adjusted depending on changes in the environment such as a drive temperature, there may be a case in which the magnitude of the strong signal does not reach the first and second reference signal levels +Vth and –Vth and the transition may not be detected, despite the generation of the strong signal. Therefore, in the signal receiving device according to one or more the present example embodiments, before the clock data recovery operation is performed in earnest, by performing calibration in consideration of environmental changes, reliability may be further ensured in the transition detection.

Hereinafter, a signal receiving system according to some embodiments which adopts the signal receiving device will be described with reference to FIGS. 13 and 14.

Figure 13:
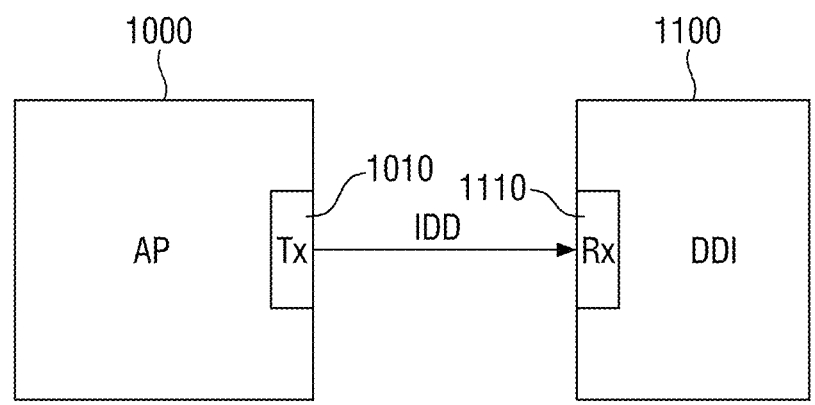
FIG. 13 is a conceptual block diagram of a signal receiving system according to some example embodiments.

FIG. 13 is a conceptual block diagram of the signal receiving system according to some example embodiments.

Referring to FIG. 13, the signal receiving system may include an application processor 1000 and a display driver IC 1100.

The application processor 1000 may generate image display data IDD to be displayed to a user or the like, and provide it to the display driver IC 1100.

Specifically, the application processor 1000 includes a transmission unit 1010 that transmits image display data IDD, and may provide the image display data IDD to the display drive IC 1100 through the transmission unit 1010.

The display driver IC 1100 includes a reception unit 1110 that receives the image display data IDD, and may receive the image display data IDD from the application processor 1000 through the reception unit 1110.

According to some example embodiments, a MIPI C-PHY interface may be adopted between the transmission unit 1010 and the reception unit 1110, and the reception unit 1110 may include a signal receiving device explained above.

Figure 14:
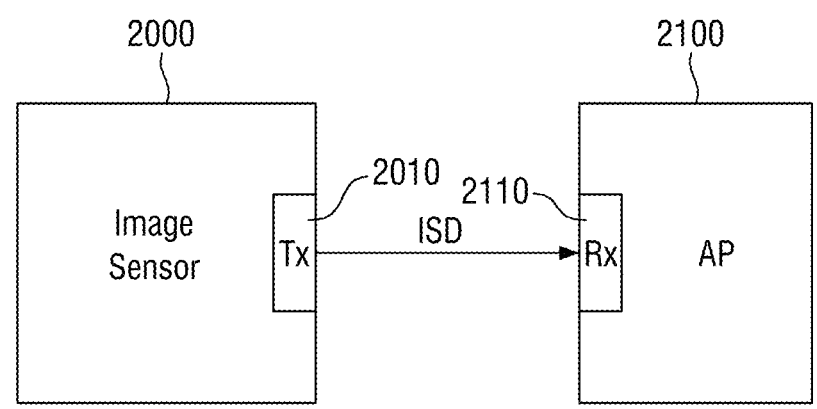
FIG. 14 is a conceptual block diagram of the signal receiving system according to some example embodiments.

FIG. 14 is a conceptual block diagram of the signal receiving system according to some example embodiments.

Referring to FIG. 14, the signal receiving system may include an image sensor 2000 and an application processor 2100.

For example, the image sensor 2000 may sense an image using a camera module or the like, and then generate the image sensing data ISD on the basis of the sensed image. The image sensing data ISD thus generated may be provided to the application processor 2100.

Specifically, the image sensor 2000 includes a transmission unit 2010 that transmits image sensing data ISD, and may provide the image sensing data ISD to the application processor 2100 through the transmission unit 2010.

The application processor 2100 includes a reception unit 2110 that receives the image sensing data ISD, and may receive the image sensing data ISD from the image sensor 2000 through the reception unit 2110.

According to some embodiments, a MIPI C-PHY interface may be adopted between the transmission unit 2010 and the reception unit 2110, and the reception unit 2110 may include the signal receiving device explained above.

As discussed above, the calibration device 300 and the counter 310 included in the calibration device 300 may be disposed in an analog circuit block of the signal receiving device, and the calibration logic 320 of the calibration device 300 and the decoder 400 may be disposed in a digital logic block of the signal receiving device.

The analog circuit block and the digital logic block may be implemented in special purpose processing circuitry. For example, the analog circuit block may be implemented in a field-programmable analog array (FPAA) or other analog circuitry, and the digital logic block may be implemented in logic circuits; a hardware/software combination such as a processor executing software; or a combination thereof and memory. For example, the processing circuitry more specifically may include, but is not limited to, a central processing unit (CPU), an arithmetic logic unit (ALU), a digital signal processor, a microcomputer, a field programmable gate array (FPGA), a programmable logic unit, a microprocessor, application-specific integrated circuit (ASIC), etc.

The processing circuitry may be special purpose processing circuitry that recovers data and clock from the received signal without considering jitter characteristics of the received signal and may also calibrate the signal receiving device. Therefore, the special purpose processing circuitry, may recover data and clock from the received signal without requiring an additional circuit for reflecting jitter characteristics of the received signal and, thus, enabling a size reduction.

In concluding the detailed description, those skilled in the art will appreciate that many variations and modifications may be made to the example embodiments without substantially departing from the principles of the present inventive concepts. Therefore, the disclosed example embodiments are used in a generic and descriptive sense only and not for purposes of limitation.

What is claimed is:

1. A signal receiving device comprising:
a transition detecting device configured to,
receive first to third input signals such that, in each of a plurality of unit intervals, the first to third input signals each have a different signal level relative to other ones of the first to third input signals,
determine whether a signal level of a first differential signal, which is a differential signal between the first input signal and the second input signal among the first to third input signals, is greater than a first reference signal level to output a first comparison signal of a plurality of comparison signals, and
determine whether the signal level of the first differential signal is greater than a second reference signal level different from the first reference signal level to output a second comparison signal of the plurality of comparison signals; and
a clock data recovering device configured to recover a clock signal embedded in the first to third input signals based on the first comparison signal and the second comparison signal to generate a recovery clock signal.

2. The signal receiving device of claim 1, wherein the first to third input signals are provided in accordance with a MIPI (Mobile Industry Processor Interface) C-PHY interface.

3. The signal receiving device of claim 1, wherein absolute values of the first reference signal level and the second reference signal level are equal to each other, and polarities of the first reference signal level and the second reference signal level are opposite to each other.

4. The signal receiving device of claim 1, wherein the transition detecting device is configured to,
determine whether a signal level of a second differential signal, which is a differential signal between the second input signal and the third input signal, is greater than the first reference signal level to output a third comparison signal of the plurality of comparison signals,
determine whether the signal level of the second differential signal is greater than the second reference signal level to output a fourth comparison signal of the plurality of comparison signals,
determine whether a signal level of a third differential signal, which is a differential signal between the third input signal and the first input signal, is greater than the first reference signal level to output a fifth comparison signal of the plurality of comparison signals, and
determine whether the signal level of the third differential signal is greater than the second reference signal level to output a sixth comparison signal of the plurality of comparison signals.

5. The signal receiving device of claim 4, further comprising:
a calibration device configured to count the plurality of comparison signals to adjust a first gain control signal, wherein
the signal receiving device is configured to amplify the first differential signal based on the first gain control signal.

6. The signal receiving device of claim 1, wherein the plurality of unit intervals include a first unit interval in which the first input signal has a first signal level, the second input signal has a second signal level different from the first signal level, the third input signal has a third signal level different from the first and second signal levels, and the first reference signal level is set to one of (i) a value between the first signal level and the second signal level, and (ii) a value between the second signal level and the third signal level.

7. The signal receiving device of claim 6, wherein
the second signal level is lower than the first signal level, and the third signal level is lower than the second signal level, and
the first reference signal level is set to a value between the second signal level and the third signal level.

8. The signal receiving device of claim 1, wherein the transition detecting device includes:
a first variable gain amplifier configured to amplify the signal level of the first differential signal based on a first gain control signal, and
a first level detector configured to output the first comparison signal in response to an output of the first variable gain amplifier being greater than the first reference signal level.

9. The signal receiving device of claim 8, wherein the transition detecting device further comprises:
a second variable gain amplifier configured to amplify the signal level of the first differential signal based on a second gain control signal, and
a second level detector configured to output the second comparison signal in response to an output of the second variable gain amplifier being greater than the second reference signal level.

10. The signal receiving device of claim 8, further comprising:
a calibration device configured to adjust the first gain control signal based on the first comparison signal.

11. The signal receiving device of claim 10, wherein
the transition detecting device is configured to generate a reference clock signal based on the first to third input signals, and
the calibration device is configured to adjust the first gain control signal based on the reference clock signal and the first comparison signal.

12. The signal receiving device of claim 8, wherein the first level detector includes:
a first transistor including a gate configured to receive the output of the first variable gain amplifier, the first transistor configured to ground a first output node and a second output node,
a second transistor including a gate configured receive a voltage level of the first output node, the second transistor configured to provide a power supply voltage to the second output node,
a third transistor including a gate configured receive a voltage level of the second output node, the third transistor configured to provide the power supply voltage to the first output node,
a fourth transistor including a gate configured receive the voltage level of the first output node, the fourth transistor configured to connect the second output node and the first transistor, and
a fifth transistor including a gate configured to receive the voltage level of the second output node, the fifth transistor configured to connect the first output node and the first transistor.

13. The signal receiving device of claim 12, wherein the first reference signal level is a threshold voltage of the first transistor.

14. The signal receiving device of claim 12, wherein a magnitude of the fourth transistor is different from a magnitude of the fifth transistor.

15. A signal receiving device comprising:
a first variable gain amplifier configured to amplify a signal level of a first differential signal, which is a differential signal between a first input signal and a second input signal among first to third input signals based on a first gain control signal, the first to third input signals each having a different signal level relative to other ones of the first to third input signals in each of a plurality of unit intervals;
a second variable gain amplifier configured to amplify the signal level of the first differential signal based on a second gain control signal;
a first level detector configured to output a first comparison signal in response to an output of the first variable gain amplifier being greater than a first reference signal level;
a second level detector configured to output a second comparison signal, in response to an output of the second variable gain amplifier being greater than a second reference signal level;
a clock data recovering device configured to recover a clock signal embedded in the first to third input signals based on the first comparison signal and the second comparison signal to generate a recovery clock signal; and
a calibration device configured to adjust the first gain control signal based on the first comparison signal.

16. The signal receiving device of claim 15, wherein the first level detector includes:
a first transistor including a gate configured to receive the output of the first variable gain amplifier, the first transistor configured to ground a first output node and a second output node,
a second transistor including a gate configured to receive a voltage level of the first output node, the second transistor configured to connect the second output node and the first transistor, and
a third transistor including a gate configured to receive a voltage level of the second output node, the third transistor configured to connect the first output node and the first transistor, and have a magnitude different from a magnitude of the second transistor.

17. The signal receiving device of claim 15, wherein the first to third input signals include a preamble period, a sync-word period, a packet data period, and a post period, and
the calibration device is configured to adjust the first gain control signal during the preamble period.

18. The signal receiving device of claim 15, wherein clock data recovering device includes:
a first pulse generator configured to generate a first short pulse based on the first comparison signal, a second pulse generator configured to generate a second short pulse based on the second comparison signal, an SR latch configured to output wire state information of the first to third input signals, based on the first short pulse and the second short pulse, and a plurality of OR gates configured to output the recovery clock signal based on the first short pulse and the second short pulse.

19. The signal receiving device of claim 15, wherein the calibration device is configured to adjust the second gain control signal based on the second comparison signal.

20. A signal receiving device comprising:

a first level detector configured to output a first comparison signal of a plurality of comparison signals based on a first differential signal, a first reference signal level and a second reference signal level different from the first reference signal level, the first differential signal being a differential signal between a first input signal and a second input signal among the first input signal, the second input signal and a third input signal, the first to third input signals each having a different signal level relative to other ones of the first to third input signals in each of a plurality of unit intervals;

a second level detector configured to output a second comparison signal of the plurality of comparison signals based on a second differential signal, the first reference signal level and the second reference signal level, the second differential signal being a differential signal between the second input signal and the third input signal among the first to third input signals;

a third level detector configured to output a third comparison signal of the plurality of comparison signals based on a third differential signal, the first reference signal level and the second reference signal level, the third differential signal being a differential signal between the third input signal and the first input signal;

an SR latch configured to output wire state information of the first to third input signals, based on the plurality of comparison signals; and a plurality of OR gates configured to recover a clock signal embedded in the first to third input signals based on the plurality of comparison signals to generate a recovery clock signal.

* * * * *